United States Patent [19]
George et al.

[11] Patent Number: 5,829,668
[45] Date of Patent: Nov. 3, 1998

[54] METHOD FOR FORMING SOLDER BUMPS ON BOND PADS

[75] Inventors: Reed A. George, Chandler, Ariz.; Dennis Brian Miller, Barrington, Ill.

[73] Assignee: Motorola Corporation, Schaumburg, Ill.

[21] Appl. No.: 706,863

[22] Filed: Sep. 3, 1996

[51] Int. Cl.$^6$ .............................. H05K 3/34; H01L 21/60
[52] U.S. Cl. .................. 228/254; 228/248.1; 438/616
[58] Field of Search ................... 228/248.1, 254, 228/180.22; 438/615, 616; 257/738

[56] References Cited

U.S. PATENT DOCUMENTS

| | | | |
|---|---|---|---|
| 4,396,140 | 8/1983 | Jaffe et al. | 228/254 |
| 4,545,610 | 10/1985 | Lakritz et al. | 228/180.22 |
| 5,217,597 | 6/1993 | Moore et al. . | |
| 5,429,293 | 7/1995 | Bradley, III et al. | 228/248.1 |
| 5,586,715 | 12/1996 | Schwiebert et al. | 228/248.1 |
| 5,643,831 | 7/1997 | Ochiai et al. | 228/254 |

OTHER PUBLICATIONS

"BGA Development Update Service, Developments in First Quarter 1996", TechSearch Intenational, Inc., Mar. 1996, pp. 12–15.

*Primary Examiner*—Samuel M. Heinrich
*Attorney, Agent, or Firm*—Douglas D. Fekete; Jonathan P. Meyer

[57] ABSTRACT

Solder paste (16) is dispensed onto a platen (12) that includes depressions (14) that are preferably conical or in an inverted pyramid shape. The solder paste (16) is formed of a plurality of particles composed of a solder alloy. Excess solder paste (16) is removed, and a predetermined solder paste volume fills the depressions (14). A substrate (18) is superposed onto platen (12) such that solder-wettable bond pads (20) on the substrate (18) register with the depressions (14). The platen (12) is heated to melt the solder alloy, and the solder alloy coalesces to form molten solder droplets (22). The solder droplets (22) are transferred onto the solder-wettable bond pads (20) to form solder bumps (24) bonded to the bond pads (20).

14 Claims, 1 Drawing Sheet

METHOD FOR FORMING SOLDER BUMPS ON BOND PADS

FIELD OF THE INVENTION

This invention relates generally to a method for forming solder bumps on bond pads. More particularly, this invention relates to such a method wherein a solder paste is dispensed onto a platen and heated to coalesce the solder alloy in the solder paste into a molten solder droplet that is transferred to a solder-wettable bond pad.

BACKGROUND OF THE INVENTION

Solder bumps are formed on bond pads located on circuit boards and integrated circuit components, such as ball grid array and chip scale packages, to facilitate electrical connection. As the size of electronic packages has decreased, so has the size of the solder bumps used to connect them. One method of attaching solder balls to bond pads is engagement of individual solder balls, with an end effector or the like, and placement of the solder balls onto bond pads. However, due to the small size of the solder balls, typically between about 10 and 30 mils, problems arose from either having multiple solder balls on one bond pad, or missing a solder ball on a bond pad. This led to inadequate and unreliable solder bump interconnections.

Another limitation on prior art solder bumping methods is that forming small solder bumps, such as those having a diameter of less than about 10 mils, is difficult to achieve due to the handling problems associated with solder balls of this size.

Therefore, a need exists for a method for forming solder bumps on bond pads on an integrated circuit component or substrate that is reliable and able to form small solder bumps.

Further, a need exists for a method to attach a single solder bump onto each desired bond pad.

DETAILED DESCRIPTION OF A PREFERRED EMBODIMENT

The present invention provides a method for forming a substrate having solder bumps bonded to solder-wettable bond pads formed on the substrate. For purposes of this invention, a substrate can be a rigid printed circuit board, a flexible printed circuit board, or an integrated circuit component, such as an integrated circuit die, a semiconductor wafer, or an integrated circuit package such as a ball grid array package. In accordance with the present invention, a solder paste is dispensed onto a platen that includes depressions defined by surfaces that are non-wettable by the solder paste. The solder paste, which includes a plurality of particles composed of a solder alloy, fills the depressions. The platen is heated to melt the solder alloy, whereupon the solder alloy coalesces to form molten solder droplets in the depressions. The molten solder droplets are transferred onto the solder-wettable bond pads on the substrate to form solder bumps bonded to the bond pads.

Figure 1:
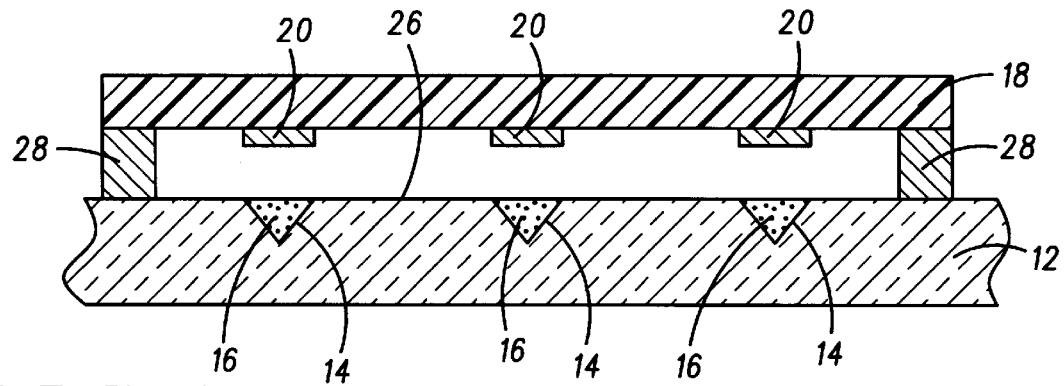
FIG. 1 is a cross-sectional view of a substrate superposed onto a platen with solder paste distributed into depressions on the platen in accordance with a preferred embodiment of the present invention.
Figure 2:
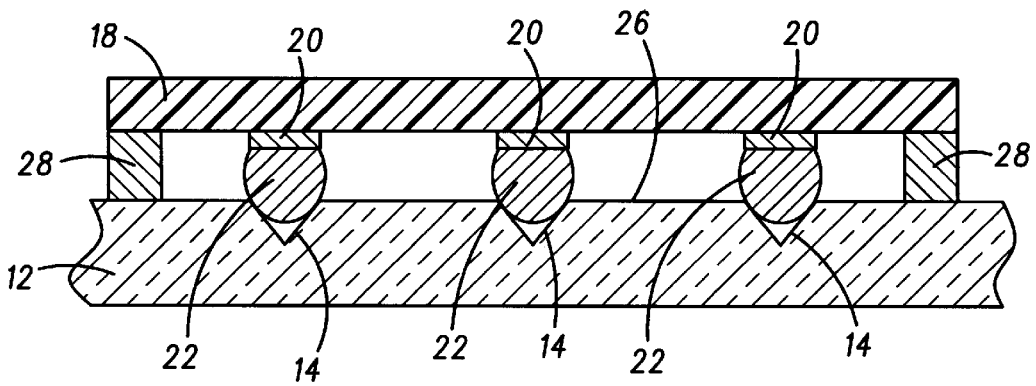
FIG. 2 is a cross-sectional view of the arrangement in FIG. 2 after heating the platen to coalesce the solder alloy in the solder paste to form solder droplets.
Figure 3:
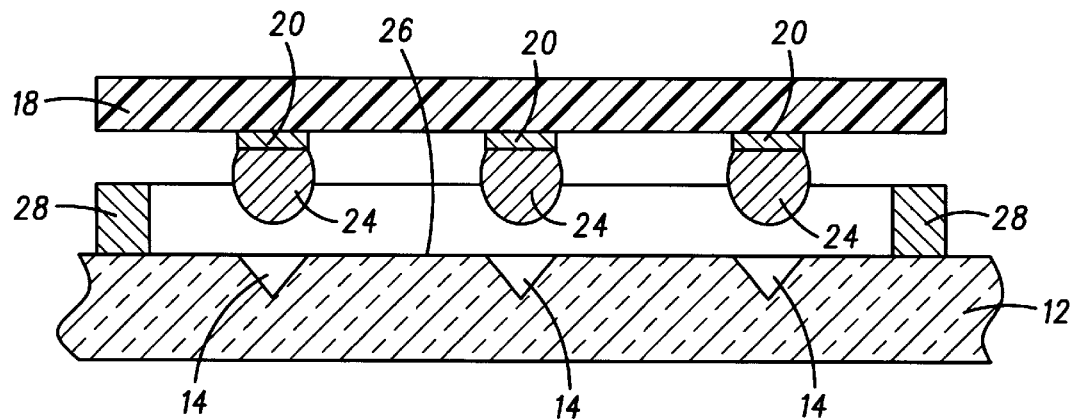
FIG. 3 is a cross-sectional view of the substrate and the solder bumps after the solder bumps have been transferred to the substrate.

A preferred embodiment of the present invention can be better understood with reference to FIGS. 1–3. In accordance with a preferred embodiment of this invention, FIG. 1 depicts a platen 12 that includes a face 26 and a plurality of depressions 14 that are sized and shaped to receive a predetermined solder paste volume. Platen 12 is formed of a solder-nonwettable composition, such as silicon or aluminum, such that solder does not bond to platen 12. In a preferred embodiment, depressions 14 are conical. Depressions 14 can also be formed in an inverted, four-sided pyramid shape. The conical or inverted pyramid shape of depressions 14 facilitates proper formation of solder droplets upon heating of the solder paste filling depressions 14.

A solder paste 16 is dispensed onto platen 12, preferably onto face 26. Solder paste 16 is formed of solder particles dispersed in a liquid vehicle. In a preferred embodiment, the liquid vehicle comprises a fluxing agent to facilitate formation of the solder bumps. A predetermined amount of solder paste is then distributed into depressions 14 with a doctor blade, squeegee, or the like. Excess solder paste not filling any of the depressions 14 is removed from platen 12. In this manner, depressions 14 contain a predetermined solder paste volume effective to form a solder bump of a predetermined size.

In a preferred embodiment, a spacer 28 is superposed onto face 26. A substrate 18 is superposed onto platen 12 by placing substrate 18 onto spacer 28. Substrate 18 is spaced apart from face 26 by a predetermined distance determined by the height of spacer 28. In an alternate embodiment, substrate 18 is superposed directly onto face 26. Substrate 18 is preferably an integrated circuit component, such as a ball grid array package, that includes a plurality of solder-wettable bond pads 20, preferably formed of copper. Substrate 18 can also be an integrated circuit die, a printed circuit board, or a semiconductor wafer. Substrate 18 is superposed onto platen 12 such that each bond pad 20 registers with a corresponding depression 14. In this manner, solder droplets formed from the solder paste in the depressions 14 will align with and contact bond pads 20.

Platen 12 is then heated and the fluxing agent in solder paste 16 facilitates coalescence of the solder alloy dispersed in solder paste 16. The solder particles in the solder paste coalesce to form solder droplets 22, as shown in FIG. 2. In the preferred embodiment, solder droplets 22 protrude from depressions 14 by a distance greater than or equal to the predetermined distance. In this manner, solder droplets 22 contact solder-wettable bond pads 20 and wet the surface to form a reliable interconnection.

The solder droplets are then cooled, which causes solder droplets 22 to harden to form solder bumps 24, as depicted in FIG. 3. Solder bumps 24 attach to bond pads 20. In a preferred embodiment, substrate 18 is then removed from platen 12 and spacer 28 and is prepared to be attached to another substrate or integrated circuit component.

Thus, the present invention provides a method for forming solder bumps on bond pads located on a substrate or an integrated circuit component. By dispensing a solder paste on a platen and distributing a predetermined amount of solder paste into depressions in the platen, uniform solder droplets are formed that in a preferred embodiment protrude from the face of the platen. The solder droplets are then transferred to bond pads on a circuit board, integrated circuit component, or semiconductor wafer, which is facilitated by the platen being formed of a solder-nonwettable material. The present invention forms a more reliable microelectronic assembly by removing problems associated with prior art methods that pick and placed small solder balls and placed them onto bond pads. Further, smaller solder bumps can be formed, having a diameter of less than 10 mils. Smaller solder bumps allow the size of substrates to decrease, and further allows components to be mounted in smaller areas on circuit boards, thereby making the circuit boards and the resulting assemblies smaller and lighter.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A method for forming a substrate comprising solder-wettable bond pads and solder bumps bonded to the bond pads, the method comprising:

fabricating a platen having a face comprising a plurality of solder-nonwettable depressions that are sized and shaped to contain a predetermined solder paste volume;

dispensing a solder paste onto the face to fill the depressions, said solder paste comprising a plurality of solder particles;

superposing a substrate over the platen spaced by a predetermined distance, said substrate comprising a plurality of solder-wettable bond pads that register with the depressions;

heating the platen to melt the solder particles while said substrate is superposed, whereupon the solder particles coalesce to form molten solder droplets that protrude from the depressions into contact with the solder-wettable bond pads, thereby transferring the molten solder droplets onto the solder-wettable bond pads to form solder bumps bonded to the bond pads.

2. A method for forming a substrate in accordance with claim 1, wherein the step of dispensing comprises:

applying the solder paste onto the face;

distributing a predetermined amount of solder paste into each of the depressions; and removing excess solder paste.

3. A method for forming a substrate in accordance with claim 1, wherein the step of transferring comprises cooling the solder droplets to bond the solder bumps to the bond pads.

4. A method for forming a substrate in accordance with claim 1, wherein the solder particles are dispersed in a liquid vehicle.

5. A method for forming a substrate in accordance with claim 1, wherein the molten solder droplets protrude from the face.

6. A method for forming a substrate in accordance with claim 1, wherein the step of superposing a substrate on the platen comprises:

superposing a spacer onto the platen; and superposing a substrate onto the spacer.

7. A method for forming an integrated circuit component comprising solder-wettable bond pads and solder bumps bonded to the bond pads, the method comprising:

fabricating a platen having a face comprising a plurality of conical depressions, each depression being defined by solder-nonwettable surfaces and sized to contain a predetermined solder paste volume;

dispensing a solder paste onto the face to fill the depressions, said solder paste comprising a liquid vehicle and a plurality of particles composed of a solder alloy dispersed in the liquid vehicle;

superposing an integrated circuit component over the platen spaced by a predetermined distance, said integrated circuit component comprising a plurality of solder-wettable bond pads that register with the depressions;

heating the platen to melt the solder alloy while said integrated circuit component is superposed, whereupon the solder alloy coalesces to form molten solder droplets that protrude above the face by a distance at least equal to the predetermined distance so as to contact the solder-wettable bond pads, thereby transferring the molten solder droplets onto the solder-wettable bond pads to form solder bumps on the integrated circuit component.

8. A method for forming an integrated circuit component in accordance with claim 7, wherein the integrated circuit component is spaced apart from the face by a predetermined distance, and wherein the molten solder droplets protrude above the face by a distance greater than or equal to the predetermined distance.

9. A method for forming a substrate in accordance with claim 7, wherein the step of dispensing comprises:

applying the solder paste onto the face;

distributing a predetermined amount of solder paste into each of the depressions; and removing excess solder paste.

10. A method for forming an integrated circuit component in accordance with claim 7, wherein the liquid vehicle includes a fluxing agent to facilitate coalescence of the solder alloy.

11. A method for forming an integrated circuit component in accordance with claim 7, wherein the platen is formed of silicon.

12. A method for forming an integrated circuit component in accordance with claim 7, wherein the platen is formed of aluminum.

13. A method for forming an integrated circuit component in accordance with claim 7, wherein the integrated circuit component is a silicon wafer.

14. A method for forming a substrate in accordance with claim 7, wherein the step of superposing an integrated circuit component onto the platen comprises:

superposing a spacer onto the platen; and superposing an integrated circuit component onto the spacer.

* * * * *